(12) United States Patent
Zhu et al.

(10) Patent No.: US 11,094,238 B2
(45) Date of Patent: Aug. 17, 2021

(54) DISPLAY PANEL AND DISPLAY DEVICE

(71) Applicant: Shanghai Tianma AM-OLED Co., Ltd., Shanghai (CN)

(72) Inventors: Renyuan Zhu, Shanghai (CN); Yue Li, Shanghai (CN); Dongxu Xiang, Shanghai (CN); Yana Gao, Shanghai (CN); Xingyao Zhou, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 6 days.

(21) Appl. No.: 16/265,098

(22) Filed: Feb. 1, 2019

(65) Prior Publication Data
US 2019/0333433 A1 Oct. 31, 2019

(30) Foreign Application Priority Data

Apr. 27, 2018 (CN) .......................... 201810393082.9

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2310/0286* (2013.01); *G09G 2320/0233* (2013.01)

(58) Field of Classification Search
None
See application file for complete search history.

(56) References Cited

U.S. PATENT DOCUMENTS

| 6,724,361 | B1 * | 4/2004 | Washio | G09G 3/3677 345/100 |
|---|---|---|---|---|
| 10,706,786 | B2 * | 7/2020 | Jang | G09G 3/3233 |
| 2006/0001638 | A1 * | 1/2006 | Jeon | G09G 3/3677 345/100 |
| 2014/0375616 | A1 * | 12/2014 | Kim | G09G 3/3266 345/211 |
| 2017/0287413 | A1 * | 10/2017 | Li | G09G 3/34 |
| 2019/0197976 | A1 * | 6/2019 | Sasaki | G09G 3/3648 |

FOREIGN PATENT DOCUMENTS

| CN | 107403604 A | 11/2017 |
|---|---|---|
| CN | 107610636 A | 1/2018 |

OTHER PUBLICATIONS

Chinese Office Action for related Chinese Application No. 201810393082.9; reported on Oct. 26, 2020.

* cited by examiner

*Primary Examiner* — Dorothy Harris
(74) *Attorney, Agent, or Firm* — von Briesen & Roper s.c.

(57) ABSTRACT

Provided is a display panel and display device. A display area of a display panel includes a first area and a second area. The number of pixel units in each row in the first area is less than the number of pixel units in each row in the second area. The scanning lines electrically connected to the first shift registers are disposed in the first area, and the scanning lines electrically connected to the second shift registers are disposed in the second area. The first shift registers and the second shift registers are electrically connected to a first clock signal line, and the first shift registers are electrically connected to the first clock signal line through resistance compensation units.

7 Claims, 13 Drawing Sheets

DISPLAY PANEL AND DISPLAY DEVICE

CROSS-REFERENCE TO RELATED APPLICATIONS

This application claims priority to Chinese patent application No. 201810393082.9filed on Apr. 27, 2018, the disclosure of which is incorporated herein by reference in its entirety.

TECHNICAL FIELD

Embodiments of the present disclosure relate to the field of display technology and, in particular, to a display panel and display device.

BACKGROUND

A display panel generally includes a display area for displaying images and a non-display area for disposing a peripheral driving circuit. Pixel units arranged in an array in the display area are electrically connected to the driving circuit through respective switch components. At present, the display area in common display panels usually has a regular rectangle shape. That is, the number of pixel units in each row is substantially the same, and a scanning line drives the pixel units in one row at the same time to display.

With the development of display technology and higher requirements of users on the display screen, irregular-shaped display screens appear successively, such as a full screen with an increased screen-to-body ratio. In this case, pixel units in a special-shaped area of the display area cannot be arranged in a rectangular array, and the number of the pixel units in each row is not exactly the same, so that different scanning lines have different loads. Thus when the scanning lines provide the same scan driving signal, the display brightness in the special-shaped area is inconsistent with the display brightness in a non-special-shaped area, leading to poor display uniformity.

SUMMARY

In view of this, the present disclosure provides a display panel and display device. First shift registers and second shift registers are electrically connected to a first clock signal line, and the first shift registers are electrically connected to the first clock signal line through respective resistance compensation units; or, the first shift registers are electrically connected to a second clock signal line, the second shift registers are electrically connected to a third clock signal line, and a duty ratio of an effective signal on the second clock signal line is greater than a duty ratio of an effective signal on the third clock signal line, so that a delay of the first shift registers outputting scan driving signals to scanning lines in the first area is increased, and the display uniformity of the display panel is improved.

In a first aspect, embodiments of the present disclosure provide a display panel, including a display area and a peripheral circuit surrounding the display area.

The display area includes a first area and a second area. The display area includes multiple scanning lines extending along a first direction. Along the first direction, the number of pixel units in each row in the first area is less than a number of pixel units in each row in the second area.

The peripheral circuit area is provided with multiple shift registers. The shift registers include multiple first shift registers and multiple second shift registers. Each of the multiple first shift registers and each of the multiple second shift registers are electrically connected to respective ones of the scanning lines. Part of the scanning lines electrically connected to the first shift registers are disposed in the first area, and the other part of the scanning lines electrically connected to the second shift registers are disposed in the second area.

The first shift registers and the second shift registers are all electrically connected to a first clock signal line, and the first shift registers are electrically connected to the first clock signal line through resistance compensation units. Alternatively, the first shift registers are electrically connected to a second clock signal line, the second shift registers are electrically connected to a third clock signal line, and a duty ratio of an effective signal on the second clock signal line is greater than a duty ratio of an effective signal on the third clock signal line.

In a second aspect, embodiments of the present disclosure provide a display device of the display panel described in the first aspect.

The embodiments of the present disclosure provide a display panel and display device. A display area of the display panel includes a first area and a second area. Along a first direction of scanning lines, the number of pixel units in each row in the first area is less than the number of pixel units in each row in the second area. The shift registers in a peripheral circuit area includes multiple first shift registers and multiple second shift registers. Each of the multiple first shift registers and each of the multiple second shift registers are electrically connected to respective ones of the multiple scanning lines. Part of the scanning lines electrically connected to the first shift registers are located in the first area, and the other part of the scanning lines electrically connected to the second shift registers are located in the second area. The first shift registers and the second shift registers are all electrically connected to a first clock signal line, and the first shift registers are electrically connected to the first clock signal line through respective resistance compensation units. As such, a load of each branch in which the first clock signal line is connected to the first shift register is increased. Therefore, a delay of the first shift registers outputting scan driving signals to the scanning lines in the first area is increased, the difference between the delay of the scanning lines outputting the scan driving signals in the first area and the delay of the scanning lines outputting the scan driving signals in the second area caused by the number of pixel units in each row in the first area less than the number of pixel units in each row in the second area is reduced, and the difference in display brightness between the first area and the second area is reduced, thus the display uniformity of the display panel is improved. Alternatively, the first shift registers are electrically connected to a second clock signal line, the second shift registers are electrically connected to a third clock signal line, and a duty ratio of an effective signal on the second clock signal line is greater than a duty ratio of an effective signal on the third clock signal line. As such, the delay of the first shift registers outputting the scan driving signals to the scanning line in the first area can also be increased, and the difference in display brightness between the first area and the second area is reduced, thereby improving the display uniformity of the display panel.

BRIEF DESCRIPTION OF DRAWINGS

Other features, objects and advantages of the present disclosure will become more apparent from a detailed description of non-restrictive embodiments with reference to the accompanying drawings.

DETAILED DESCRIPTION

Figure 1:
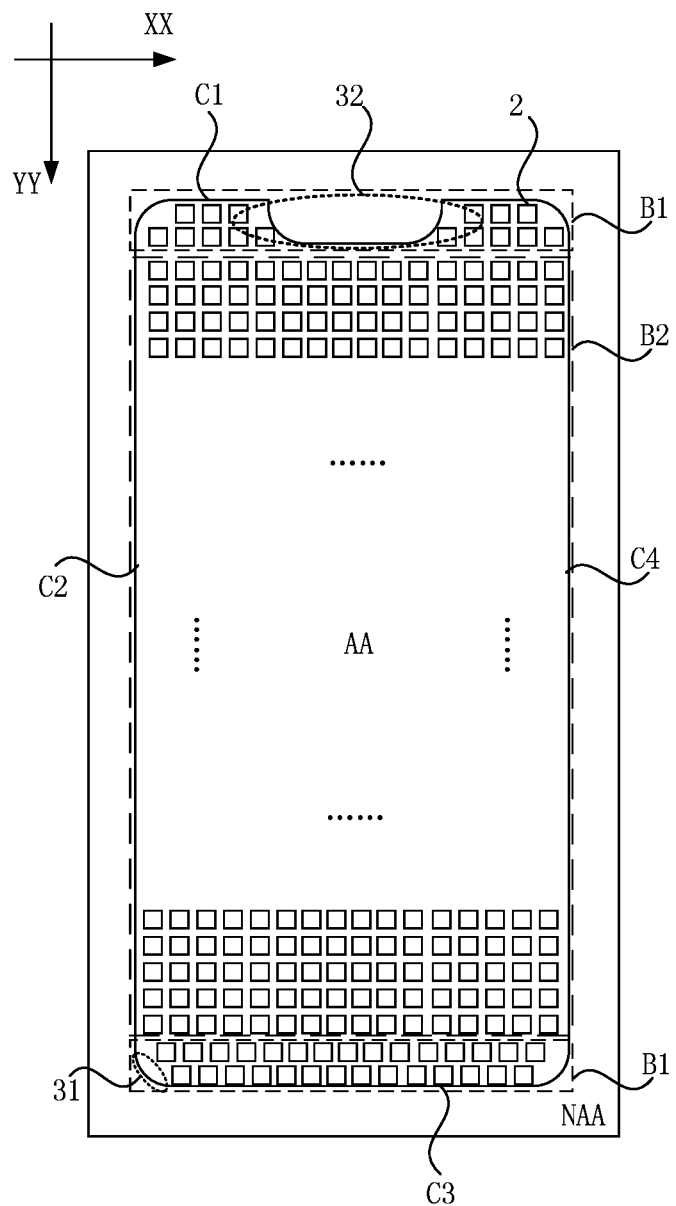
FIG. 1 is a structural diagram of a display panel according to an embodiment of the present disclosure.

The present disclosure will be further described in detail with reference to the accompanying drawings and embodiments. It is to be understood that the embodiments set forth below are intended to illustrate and not to limit the present disclosure. Additionally, it is to be noted that to facilitate description, only part, not all, of structures related to the present disclosure are illustrated in the accompanying drawings. Throughout this description, same or similar reference numbers in the accompanying drawings denote same or similar structures, components and processes. It is to be noted that if not in collision, the embodiments and features therein in the present disclosure can be combined with each other.

A display panel provided by an embodiment of the present disclosure includes a display area and a peripheral circuit area surrounding the display area. The display area includes a first area and a second area. The display area includes multiple scanning lines extending along a first direction. Along the first direction, the number of pixel units in each row in the first area is less than the number of pixel units in each row in the second area.

The peripheral circuit area is provided with multiple shift registers. The shift registers include multiple first shift registers and multiple second shift registers. Each of the multiple first shift registers and each of the multiple second shift registers are electrically connected to respective ones of the scanning lines. Part of the scanning lines electrically connected to the first shift registers are disposed in the first area, and the other part of the scanning lines electrically connected to the second shift registers are disposed in the second area. The first shift registers and the second shift registers are electrically connected to a first clock signal line, and the first shift registers are electrically connected to the first clock signal line through respective resistance compensation units. Alternatively, the first shift registers are electrically connected to a second clock signal line, the second shift registers are electrically connected to a third clock signal line, and a duty ratio of an effective signal on the second clock signal line is greater than a duty ratio of an effective signal on the third clock signal line.

A display panel generally includes the display area for displaying images and a non-display area for disposing a peripheral driving circuit. Pixel units arranged in an array in the display area are electrically connected to the driving circuit through respective switch components. At present, the display area in common display panels usually has a regular rectangle shape. That is, the number of pixel units in each row is substantially the same, and a scanning line drives the pixel units in one row at the same time to display. With the development of display technology and higher requirements of users on the display screen, irregular shaped display screens appear successively, such as a full screen with an increased screen-to-body ratio. In this case, pixel units in a special-shaped area of the display area cannot be arranged in a rectangle array, and the number of the pixel units in each row is not exactly the same, so that different scanning lines have different loads. Thus when the scanning line provides the same scan driving signal, the display brightness in the special-shaped area is inconsistent with the display brightness in a non-special-shaped area, leading to poor display uniformity.

The embodiments of the present disclosure provide a display panel and display device. A display area of the display panel includes a first area and a second area. Along a first direction of scanning lines, the number of pixel units in each row in the first area is less than the number of pixel units in each row in the second area. The shift registers in a peripheral circuit area includes multiple first shift registers and multiple second shift registers. Each of the multiple first shift registers and each of the multiple second shift registers are electrically connected to respective ones of the multiple scanning lines. Part of the scanning lines electrically connected to the first shift registers are located in the first area, and the other part of the scanning lines electrically connected to the second shift registers are located in the second area. The first shift registers and the second shift registers are all electrically connected to a first clock signal line, and the first shift registers are electrically connected to the first clock signal line through respective resistance compensation units. As such, a load of each branch in which the first clock signal line is connected to the first shift register is increased. Therefore, a delay of the first shift registers outputting scan driving signals to the scanning lines in the first area is increased, the difference between the delay of the scanning lines outputting the scan driving signals in the first area and the delay of the scanning lines outputting the scan driving signals in the second area caused by the number of pixel units in each row in the first area less than the number of pixel units in each row in the second area is reduced, and the difference in display brightness between the first area and the second area is reduced, thus the display uniformity of the display panel is improved. Alternatively, the first shift registers are electrically connected to a second clock signal line, the second shift registers are electrically connected to a third clock signal line, and a duty ratio of an effective signal on the second clock signal line is greater than a duty ratio of an effective signal on the third clock signal line. As such, the delay of the first shift registers outputting the scan driving signals to the scanning line in the first area can also be increased, and the difference in display brightness between the first area and the second area is reduced, thereby improving the display uniformity of the display panel.

Figure 2:
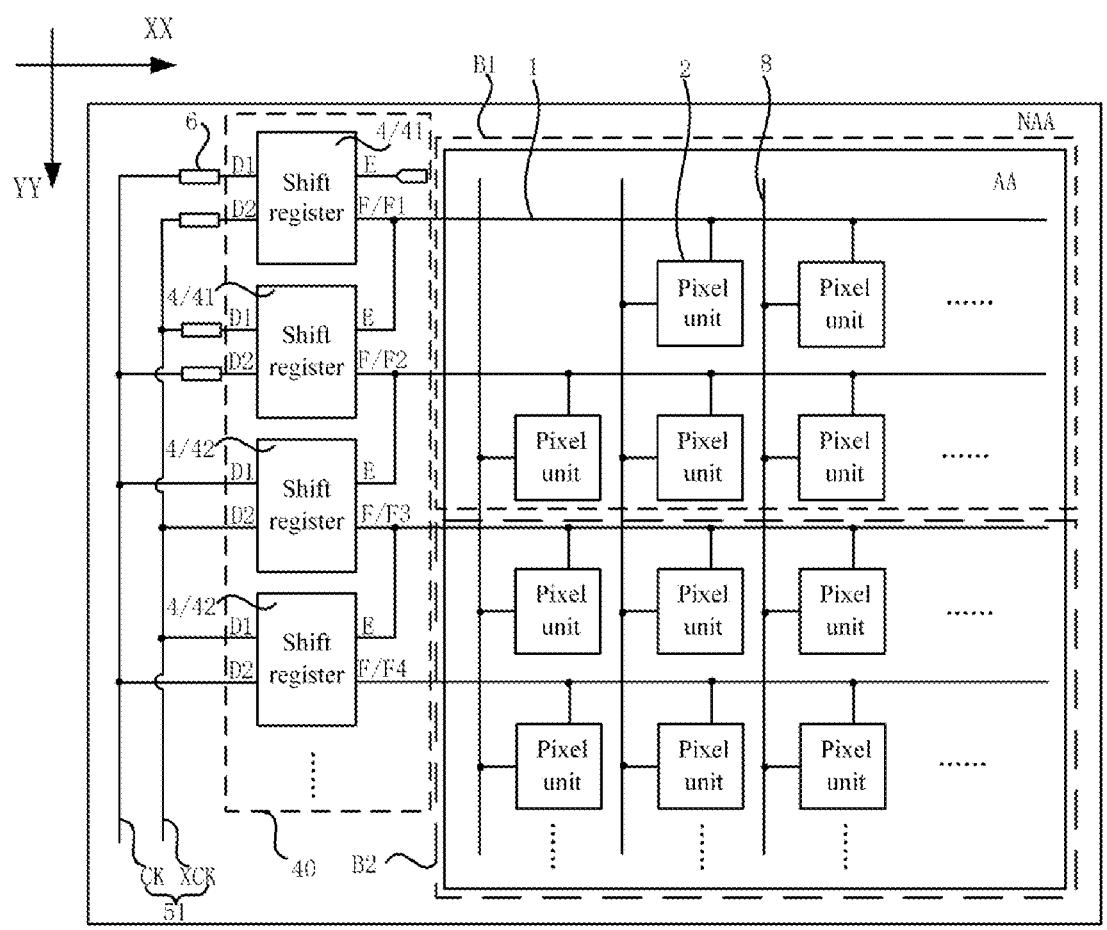
FIG. 2 is a partial enlarged schematic diagram of FIG. 1.

FIG. 1 is a structural diagram of a display panel according to an embodiment of the present disclosure. FIG. 2 is a partial enlarged schematic diagram of FIG. 1. Referring to FIGS. 1 and 2, a display panel includes a display area AA and a peripheral circuit area NAA surrounding the display area AA. The display area AA includes a first area B1 and a second area B2. The display area includes multiple scanning lines 1 extending along a first direction XX. Along the first direction XX, the number of pixel units 2 in each row in the first area B1 is less than the number of pixel units 2 in each row in the second area B2.

In one embodiment, as shown in FIG. 1, the display area AA of the display panel may include a first edge C1 and a third edge C3 disposed opposite to each other, as well as a second edge C2 and a fourth edge C4 disposed opposite to each other. The first edge C1 and the third edge C3 extend along the first direction XX. The second edge C2 and the fourth edge C4 extend along a second direction YY. The second direction YY is perpendicular to the first direction XX along which the scanning lines 1 extend. Any adjacent edges are connected through a round corner 31. For example, the first edge C1 is connected to the second edge C2 and the fourth edge C4 respectively through round corners 31, the third edge C3 is connected to the second edge C2 and the fourth edge C4 respectively through round corners 31, and the round corners 31 may be disposed in the first area B1. The second area B2 is a regular rectangle area, the number of pixel units 2 in each row in the second area B2 is substantially the same. The of the round corners 31 in the first area B1 enables that along the first direction XX, the number of pixel units 2 in each row in the first area B1 is less than the number of pixel units 2 in each row in the second area B2.

In one embodiment, the first edge C1, the second edge C2, the third edge C3 or the fourth edge C4 may form a notch 32 in the first area B1. In FIG. 1, as an example, the first edge C1 forms the notch 32, and the notch 32 on the first edge C1 is located in the first area B1. The design of the notch 32 in the first area B1 also enables that along the first direction XX, the number of pixel units 2 in each row in the first area B1 is less than the number of pixel units 2 in each row in the second area B2.

Referring to FIGS. 1 and 2, the peripheral circuit area NAA is provided with multiple shift registers 4. The multiple shift registers 4 include multiple first shift registers 41 and multiple second shift registers 42. Each of the first shift registers 41 and the second shift registers 42 is electrically connected to a respective scanning line 1. The scanning lines 1 electrically connected to the first shift registers 41 are disposed in the first area B1, and the scanning lines 1 electrically connected to the second shift registers 42 are disposed in the second area B2. The first shift registers 41 and the second shift registers 42 may be electrically connected to a first clock signal line 51, and each first shift register 41 is electrically connected to the first clock signal line 51 through a resistance compensation unit 6.

Exemplarily, four cascaded shift registers 4 are shown in FIG. 2. A shift register 4 at each stage includes a first clock signal end D1, a second clock signal end D2, a trigger signal input end E and a drive signal output end F. The drive signal output end F of the shift register 4 at each stage, except for the shift register at the last stage, is electrically connected to the trigger signal input end E of the shift register 4 at a next stage. The trigger signal input end E of the shift register 4 at the first stage receives a trigger signal sent by a trigger signal line (not shown in FIG. 2). Each shift register 4 outputs a scan driving signal to a corresponding scanning line through the drive signal output end F according to a first clock signal input through the first clock signal end D1, a second clock signal input through the second clock signal end D2 and a trigger signal input through the trigger signal input end E.

As shown in FIG. 2, the first clock signal line 51 includes a first sub-clock signal line CK and a second sub-clock signal line XCK. The first clock signal ends D1 of the shift registers 4 at even-numbered stages may be electrically connected to the first sub-clock signal line CK, and the second clock signal ends D2 of the shift register 4 at even-numbered stages may be electrically connected to the second sub-clock signal line XCK; alternatively, the first clock signal ends D1 of the shift registers 4 at odd-numbered stages may be electrically connected to the second sub-clock signal line XCK, and the second clock signal ends D2 of the shift registers 4 at odd-numbered stages may be electrically connected to the first sub-clock signal line CK.

Figure 3:
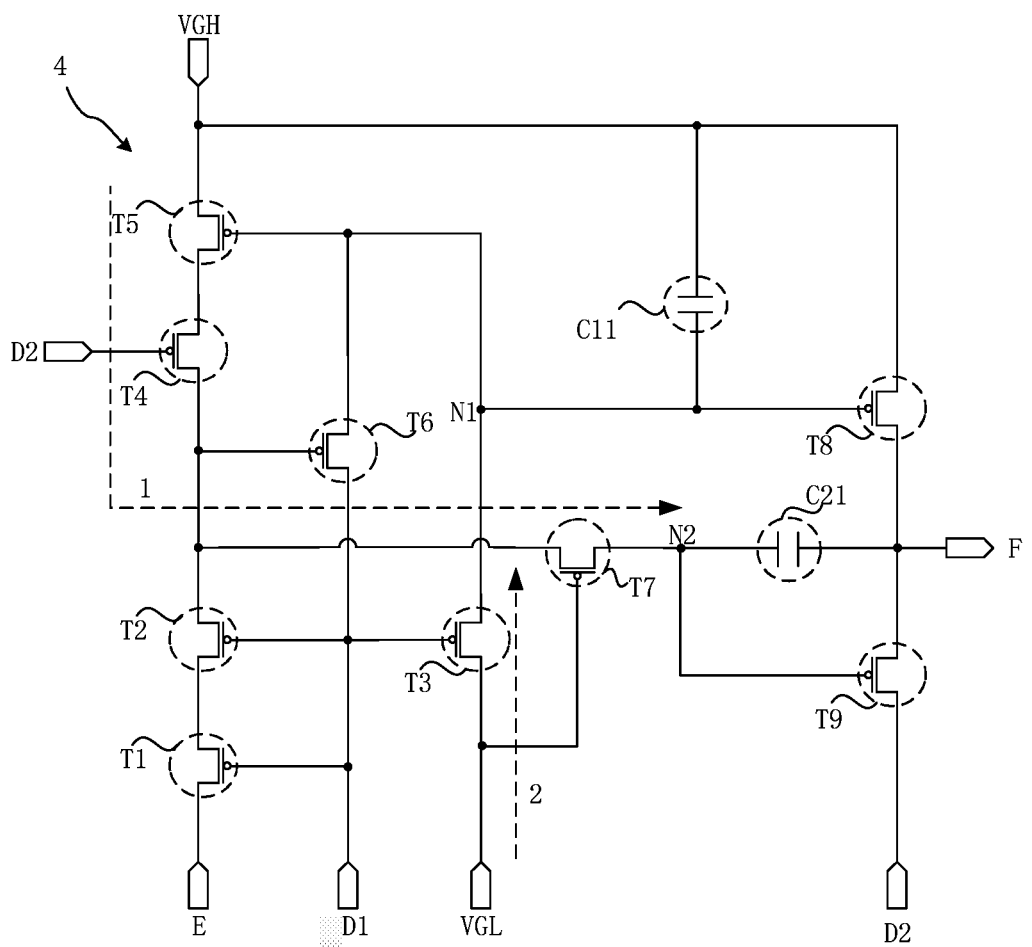
FIG. 3 is a structural diagram illustrating a specific circuit of a shift register according to an embodiment of the present disclosure.
Figure 4:
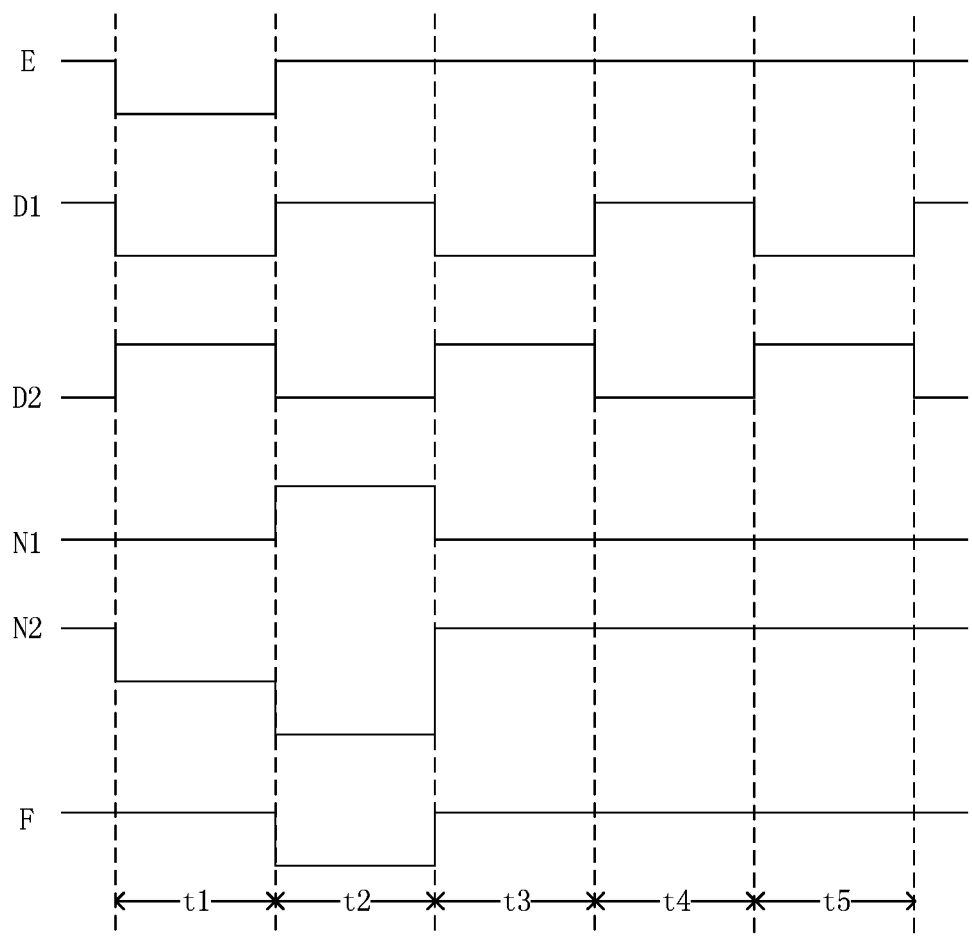
FIG. 4 is a drive timing diagram of the shift register shown in FIG. 3.

FIG. 3 is a structural diagram illustrating a specific circuit of a shift register according to an embodiment of the present disclosure. Referring to FIGS. 2 and 3, the shift register 4 at each stage includes a first transistor T1, a second transistor T2, a third transistor T3, a fourth transistor T4, a fifth transistor T5, a sixth transistor T6, a seventh transistor T7, an eighth transistor T8 and a ninth transistor T9, as well as a first capacitor C11 and a second capacitor C21. These transistors and capacitors are connected as shown in FIG. 3. FIG. 4 is a diagram illustrating a drive timing sequence of the shift register shown in FIG. 3. Exemplarily, all of the first transistor T1 to the ninth transistor T9 may be P-type transistors as shown in FIG. 3. Alternatively, all of the first transistor T1 to the ninth transistor T9 may be N-type transistors. This is not limited in the embodiment of the present disclosure. The working principle of the shift register 4 of the display panel is described in detail as follows in conjunction with FIGS. 3 and 4.

In stage t1, the fourth transistor T4 is turned off. The first transistor T1 to the third transistor T3 and the fifth transistor T5 to the ninth transistor T9 are turned on. Since the trigger signal input through the trigger signal input end E and the first clock signal input through the first clock signal input end D1 are both low-level, the voltage at the first node N1 and the voltage at the second node N2 are pulled down to low-level. The drive signal output end F of the shift register 4 outputs a high-level scan driving signal under the action of a second clock signal input through the second clock signal end D2 and a first power signal input through a first power signal end VGH.

In stage t2, the first transistor T1 to the third transistor T3 and the fifth transistor T5 to the eighth transistor T8 are turned off. The fourth transistor T4, the sixth transistor T6, the seventh transistor T7 and the ninth transistor T9 are turned on. Since the first clock signal input through the first clock signal end D1 is high-level, the voltage at the first node N1 is pulled up to high-level. Under the action of the second capacitor C21, the voltage at the second node N2 keeps low-level. Moreover, since the ninth transistor T9 is turned on, the voltage at the second node N2 is further pulled down. The drive signal output end F of the shift register 4 outputs a low-level scan driving signal under the action of the second clock signal input through the second clock signal end D2.

In stage t3, the fourth transistor T4 and the ninth transistor T9 are turned off. The first transistor T1 to the third transistor T3 and the fifth transistor T5 to the eighth transistor T8 are turned on. Since the first clock signal input through the first clock signal end D1 is low-level, the voltage at the first node N1 is pulled down to low-level. Since the trigger signal input through the trigger signal input end E is low-level, the voltage at the second node N2 is pulled up to high-level. The drive signal output end F of the shift register 4 outputs the high-level scan driving signal under the action of the first power signal input through the first power signal end VGH.

In stage t4, the first transistor T1 to the third transistor T3 and the sixth transistor T6 to the ninth transistor T9 are turned off. The fourth transistor T4, the fifth transistor T5, the seventh transistor T7 and the eighth transistor T8 are turned on. Under the action of the first capacitor C11, the voltage at the first node N1 keeps low-level, the voltage at the second node N2 is pulled up through a path 1. The drive signal output end F of the shift register 4 outputs the high-level scan driving signal under the action of the first power signal input through the first power signal end VGH.

In stage t5, the fourth transistor T4, the sixth transistor T6 and the ninth transistor T9 are turned off. The first transistor T1 to the third transistor T3, the seventh transistor T7 and the eighth transistor T8 are turned on. The voltage at the first node N1 keeps low-level through a path 2. Under the action of the second capacitor C21, the voltage at the second node N2 keeps low-level. The drive signal output end F of the shift register 4 outputs the high-level scan driving signal under the action of the first power signal input through the first power signal end VGH. Thereafter, the shift register 4 repeats the stage t4 and the stage t5 until the trigger signal input end E of the shift register 4 becomes low-level again.

Figure 5:
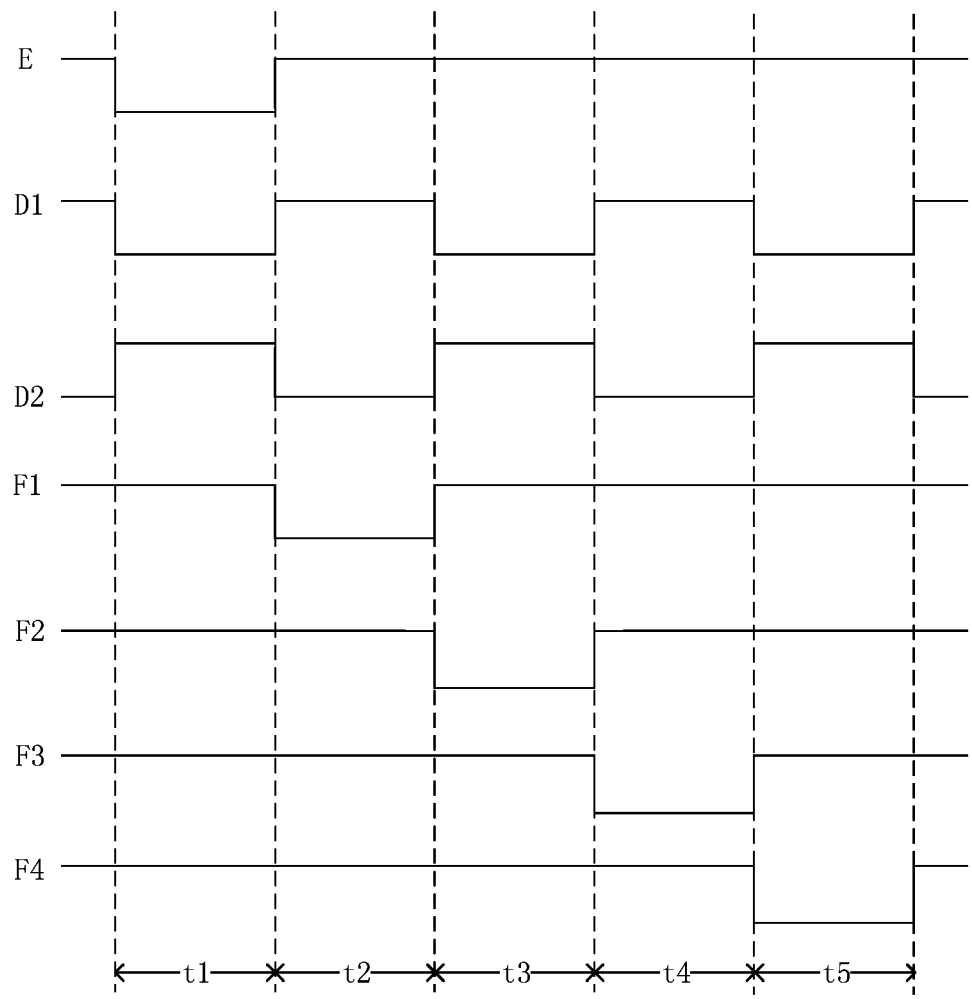
FIG. 5 is a drive timing diagram of the shift register shown in FIG. 3.

Referring to FIGS. 2, 3 and 4, since among the cascaded shift registers 4 the drive signal output end F of the shift register 4 at each stage is electrically connected to the trigger signal input end E of the shift register 4 at the next stage, the shift registers 4 at the first and second stages are taken as an example. In the stage t1, the trigger signal input end E of the shift register 4 at the first stage receives a low-level trigger signal. In the stage t2, the drive signal output end F1 of the first-stage shift register 4 outputs a low-level scan driving signal, and the scan driving signal output through the drive signal output end F1 of the first-stage shift register 4 is transferred to the trigger signal input end E of the shift register 4 at the second stage. In the stage t3, after the trigger signal input end E of the shift register 4 at the second stage receives the low-level scan driving signal, the drive signal output end F2 of the second stage shift register 4 outputs a low-level scan driving signal. The above process is repeated, so that the shift register 4 implements a shift function. The drive timing diagram of the shift register 4 is shown in FIG. 5.

Referring to FIGS. 2 and 4, the first shift register 41 is electrically connected to the first clock signal line 51 through resistance compensation units 6. That is, the first clock signal end D1 and the second clock signal end D2 of the first shift register 41 are electrically connected to respective sub-clock signal lines through resistance compensation units 6. Compared with the related art where a load of each branch in which the first clock signal line is connected to the first shift register is increased, a delay of a clock signal on the first sub-clock signal line arriving at corresponding clock signal ends of the first shift registers is increased, and the delay of a clock signal on the second sub-clock signal line arriving at corresponding clock signal ends of the first shift registers is increased, thus the delay of the first shift registers outputting scan driving signals to scanning lines in the first area is increased, the difference between the delay of the scanning lines outputting the scan driving signals in the first area and the delay of the scanning lines outputting the scan driving signal in the second area caused by the number of pixel units in each row in the first area less than the number of pixel units in each row in the second area is reduced, and the difference in display brightness between the first area and the second area is reduced, thus the display uniformity of the display panel is improved.

Figure 6:
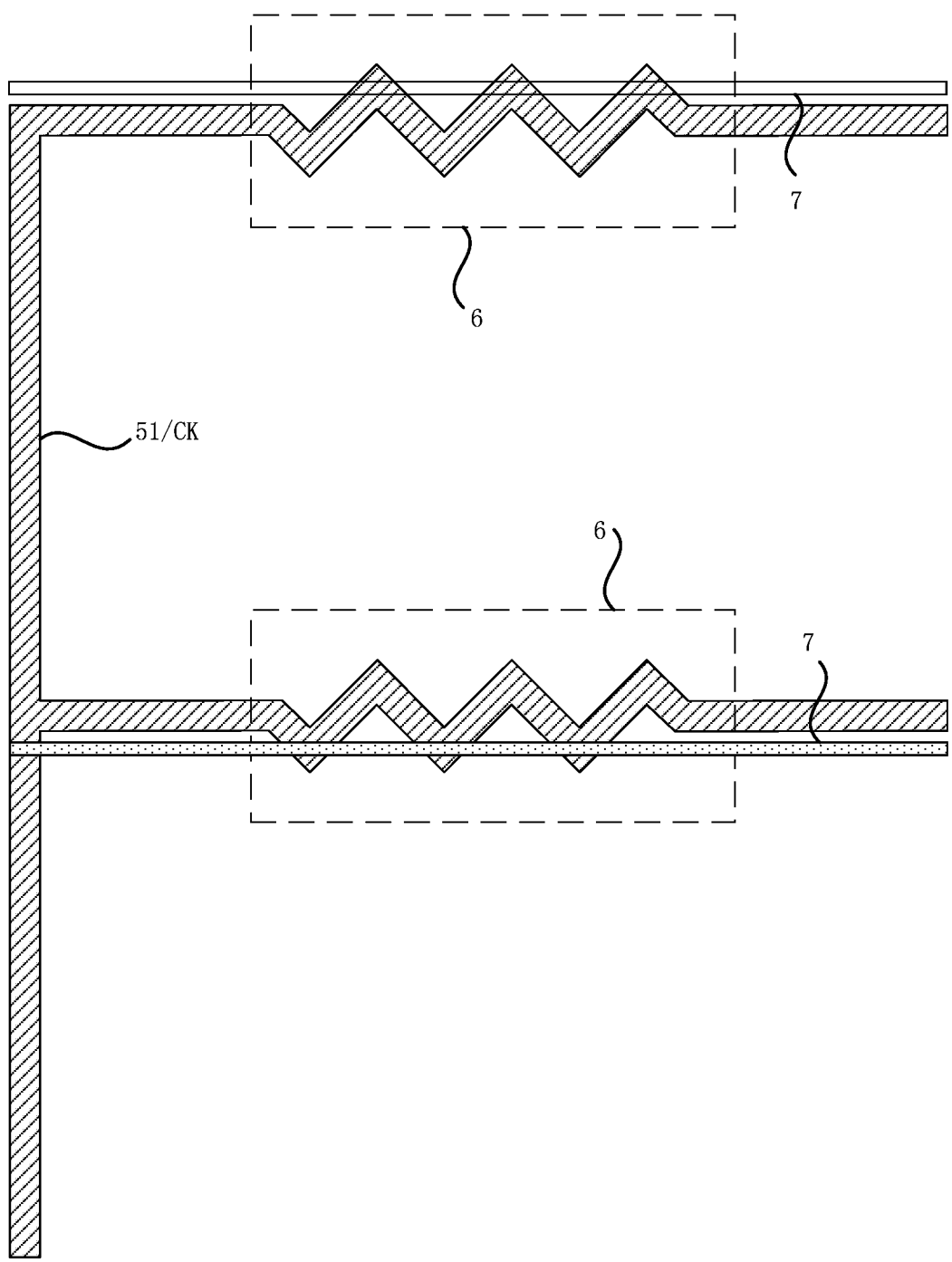
FIG. 6 is a top view of a structure of a first clock signal line and resistance compensation units according to an embodiment of the present disclosure.
Figure 7:
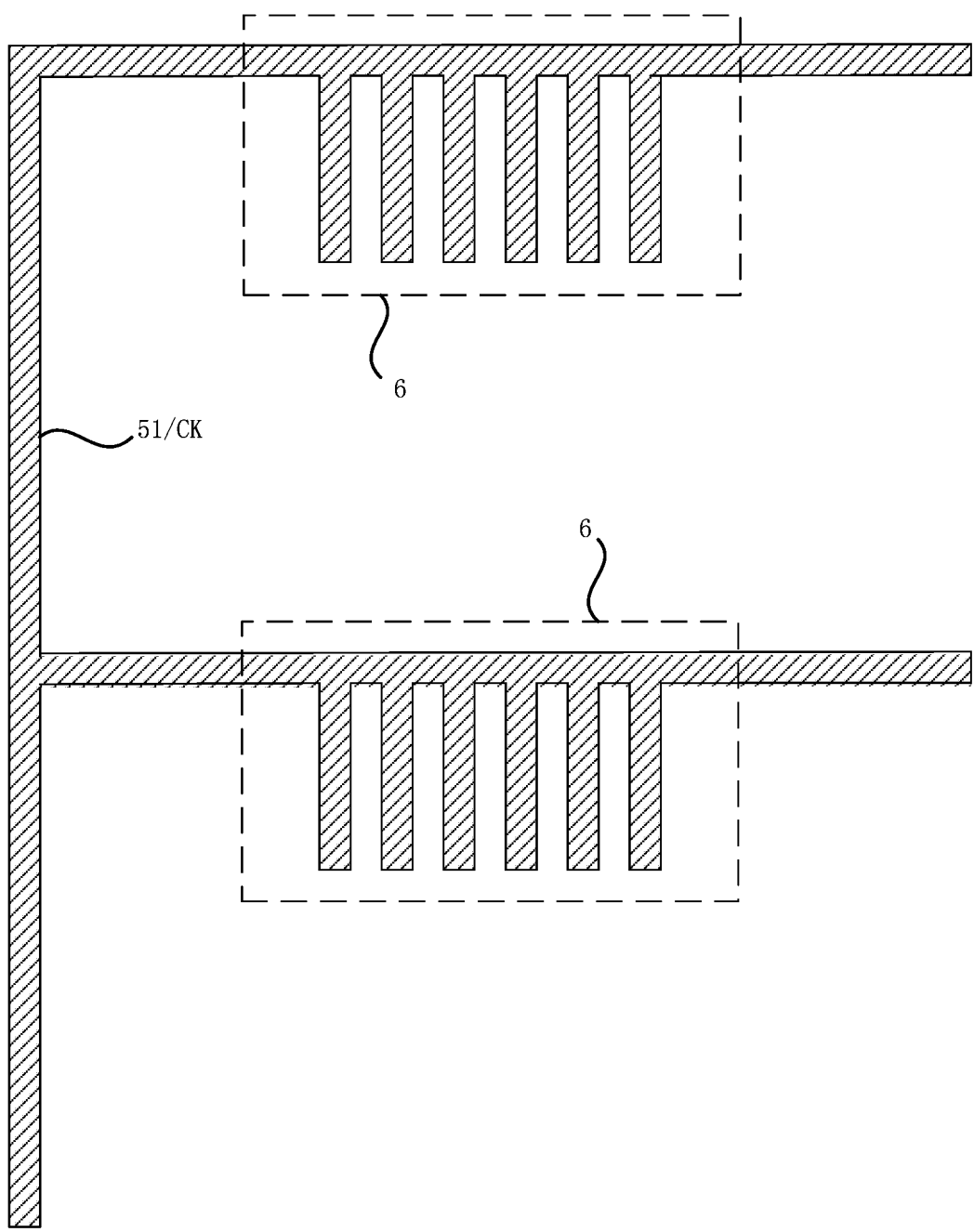
FIG. 7 is a top view of another structure of a first clock signal line and resistance compensation units according to an embodiment of the present disclosure.
Figure 8:
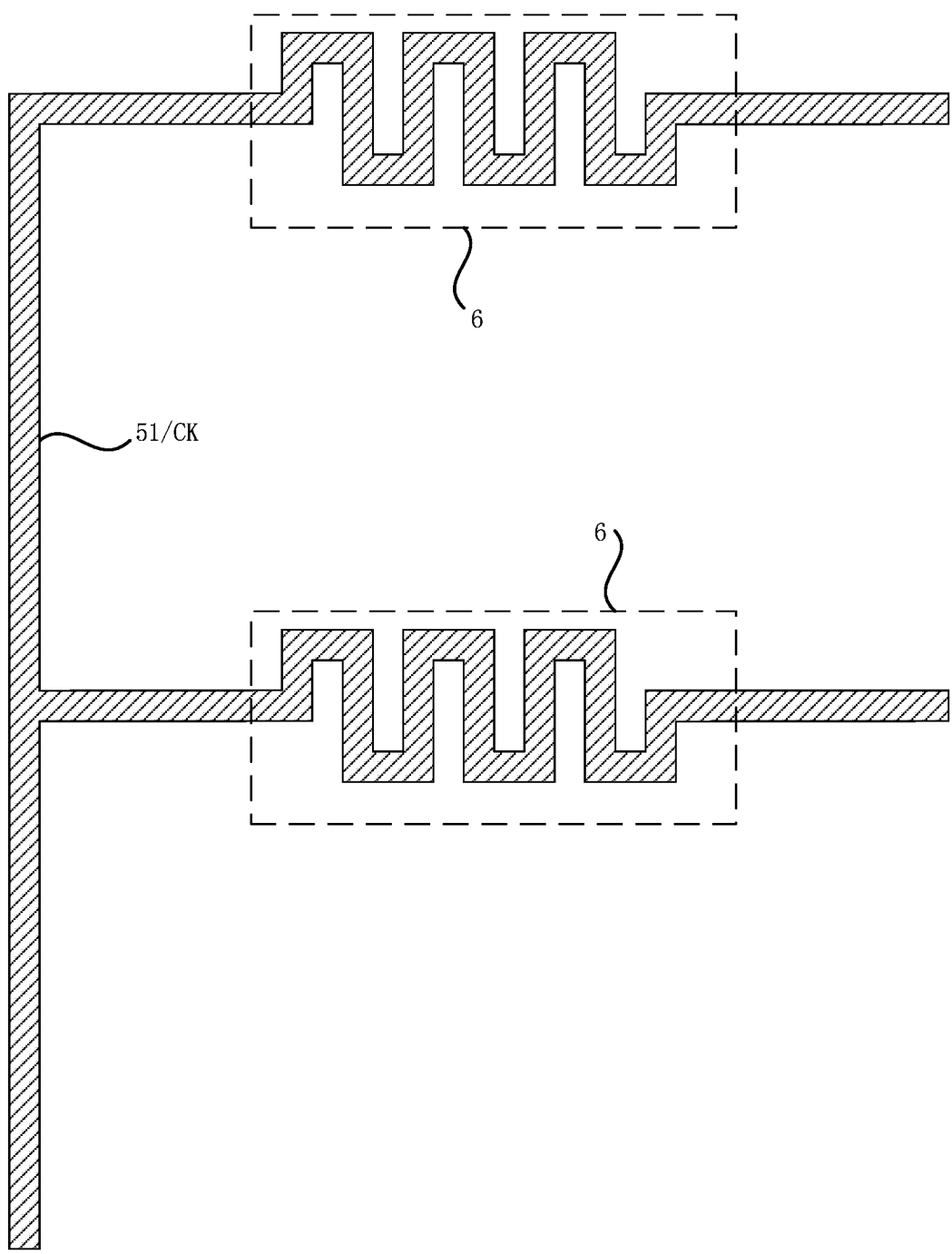
FIG. 8 is a top view of yet another structure of a first clock signal line and resistance compensation units according to an embodiment of the present disclosure.

FIG. 6 is a top view of a structure of a first clock signal line and resistance compensation units provided by the embodiment of the present disclosure. Referring to FIGS. 2 and 6, only one sub-clock signal line of the first clock signal line 51, (for example, the first sub-clock signal line CK) and the resistance compensation units 6 disposed on this sub-clock signal line are shown in FIG. 6. The resistance compensation units 6 and the first clock signal line 51 are made of the same material in the same process. That is, the resistance compensation units 6 disposed on the first clock signal line 51 are formed while the first clock signal line 51 is formed. The first sub-clock signal line CK and the second sub-clock signal line XCK are generally made of the same material in the same process. Exemplarily, the resistance compensation units 6 disposed on the first sub-clock signal line CK may be formed while the first sub-clock signal line CK is formed, and the resistance compensation units 6 disposed on the second sub-clock signal line XCK may be formed while the second sub-clock signal line XCK is formed. That is, the resistance compensation units 6 disposed on the first sub-clock signal line CK are formed through directly winding the first sub-clock signal line CK, and the resistance compensation units 6 disposed on the second sub-clock signal line XCK are formed through winding the second sub-clock signal line XCK. This simplifies the patterning process of the resistance compensation units 6, thereby simplifying the manufacturing process of the display panel. At the same time, this facilitates the interconnection of the resistance compensation units 6 and the first clock signal line 51, allowing adjustment of the resistance of the resistance compensation units 6 by changing the width or length of the first clock signal line 51. Exemplarily, the resistance compensation units 6 may have a poly-line shape as shown in FIG. 6, and may also have a comb shape as shown in FIG. 7 or a helical line shape as shown in FIG. 8. The shape of the resistance compensation units 6 is not limited in the embodiments of the present disclosure.

Figure 9:
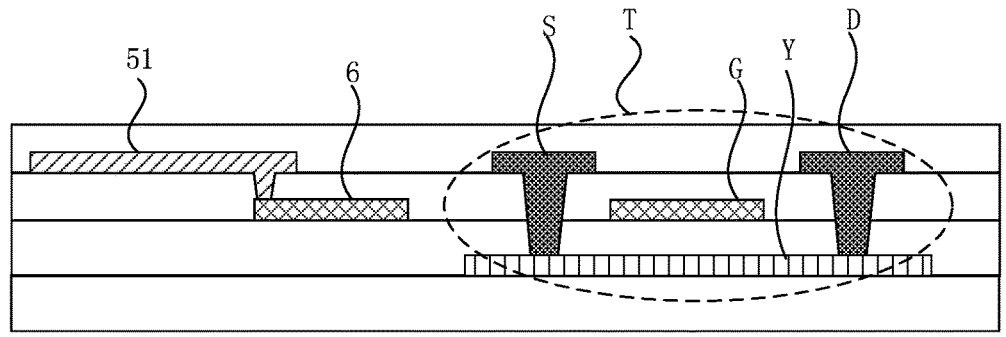
FIG. 9 is a cross-section view of a structure of a display panel according to an embodiment of the present disclosure.

FIG. 9 is a cross-sectional view of a structure of a display panel according to the embodiment of the present disclosure. Referring to FIGS. 2 and 9, the resistance compensation unit 6 and the first clock signal line 51 may be disposed in different layers, and the resistance compensation unit 6 is electrically connected to the corresponding first clock signal line 51 through a hole. Exemplarily, the display panel further includes a thin film transistor T disposed corresponding to the pixel unit 2 in the display area AA. The resistance compensation unit 6 may be made of the same material with a gate G of the thin film transistor T in the same process, as shown in FIG. 9; or may be made of the same material with an active layer Y of the thin film transistor T. Since a film in which a source S and a drain D of the thin film transistor T are disposed has small resistivity, the first clock signal line 51 may be made of the same material with the source S and the drain D of the thin film transistor T in the same process. The large resistivity of a film in which the gate G of the thin film transistor T is located and the large resistivity of the active layer Y of the thin film transistor T contribute to the reducing of the area of a resistance compensation unit 6 without changing the resistance thereof. Since the resistance compensation unit 6 is disposed in the peripheral circuit area NAA of the display panel, the resistance compensation unit 6 having reduced area facilitates implementing the narrow edge of the display panel.

In one embodiment, referring to FIGS. 2 and 6, the display panel may also include a conductive pattern layer 7. The resistance compensation unit 6 and the conductive pattern layer 7 may be configured to have an overlapping area in a direction perpendicular to the display panel. Exemplarily, the conductive pattern layer 7 and the resistance compensation unit 6 may be disposed in different layers. The conductive pattern layer 7 or the resistance compensation unit 6 may be made of a metal or a metal oxide. For example, the conductive pattern layer 7 may be a signal line for providing a reference signal or a fixed potential signal for the display panel. The resistance compensation unit 6 and the conductive pattern layer 7 have the overlapping area in a direction perpendicular to the display panel, so that a parasitic capacitor is formed by the resistance compensation unit 6 and the conductive pattern layer 7 in the overlapping area, which increases the load of the branch in which the first clock signal line 51 is connected to the first shift register 41, thus the delay of the first shift register outputting the scan driving signal to the scanning line in the first area is increased, and the display uniformity of the display panel is improved. The capacitance of the parasitic capacitor formed by the resistance compensation unit 6 and the conductive pattern layer 7 may be adjusted by changing the size of the overlapping area of the resistance compensation unit 6 and the conductive pattern layer 7.

As shown in FIG. 2, the shift registers 4 includes one group of cascaded shift registers 40. The one group of cascaded shift registers 40 is disposed in the peripheral circuit area NAA on a side of the display area AA. Exemplarily, as shown in FIG. 2, the one group of cascaded shift registers 40 is disposed in the peripheral circuit area NAA on the left side of the display area AA. The drive signal output ends F of the shift registers 4 are electrically connected to the scanning lines 1 in one-to-one correspondence. Each shift register 4 outputs a scan driving signal to the corresponding scanning line 1 through the drive signal output end F. The shift registers 4 at respective stages successively outputs the scan driving signals to the respective scanning lines 1 of the display panel. The pixel units 2 of the display panel receive the corresponding scan driving signals row by row and are turned on accordingly. Each data signal line 8 inputs a data signal to a corresponding pixel unit 2, so that the display panel implements a display function.

Figure 10:
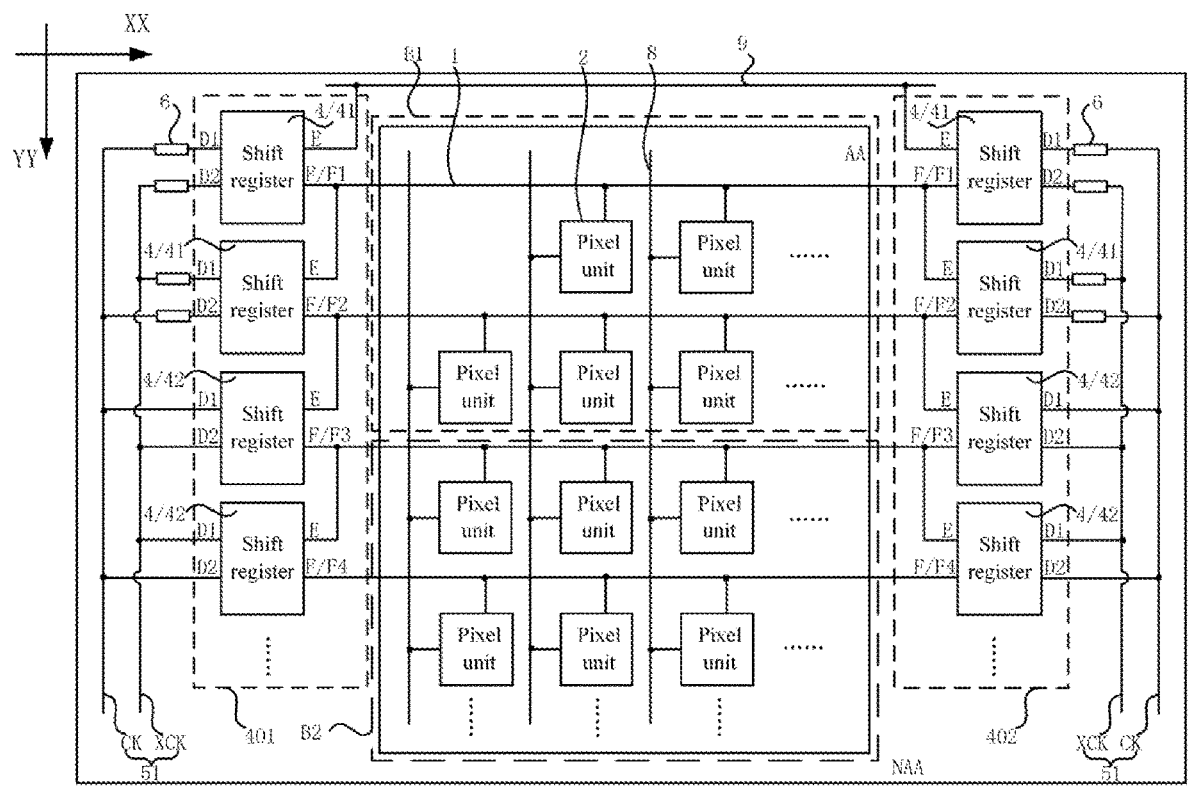
FIG. 10 is a structural diagram of another display panel according to an embodiment of the present disclosure.

FIG. 10 is a structural diagram of another display panel according to an embodiment of the present disclosure. As shown in FIG. 10, shift registers 4 include a first group of cascaded shift registers 401 and a second group of cascaded shift registers 402. The first group of cascaded shift registers 401 and the second group of cascaded shift registers 402 are disposed in two respective peripheral circuit areas NAA, which are disposed on two opposite sides of a display area AA. The shift registers 4 at the same stage in the first group of cascaded shift registers 401 and the second group of cascaded shift registers 402 are electrically connected to a same scanning line 1 for synchronously outputting scan driving signals to the same scanning line 1 through drive signal output ends F.

Exemplarily, as shown in FIG. 10, all of the first shift registers 41 in a first area B1 connected to scanning lines 1 may be electrically connected to the clock signal line 51 through resistance compensation units 6, and the resistance compensation units 6 may have the same resistance value, thereby ensuring the first shift registers 41 are connected to the same scanning line 1 synchronously outputting the scan driving signals through the drive signal output ends F to the same scanning line 1, and avoiding existence of a voltage drop on the scanning line 1 which affects the display effect of the display panel and increases the load of the branch in which the first clock signal line is connected to the first shift registers. Therefore, the delay of the first shift registers outputting scan driving signals to the scanning lines in the first area is increased, and the display uniformity of the display panel is improved.

In one embodiment, as shown in FIG. 10, the shift registers 4 at the first stage in the first group of cascaded shift registers 401 and the second group of cascaded shift registers 402 are electrically connected the same trigger signal line 9. The trigger signal line 9 is used for transferring a trigger signal to trigger signal input ends E of the shift registers 4 at the first stage in the first group of cascaded shift registers 401 and the second group of cascaded shift registers 402. Exemplarily, the trigger signal may be input synchronously at opposite ends of the trigger signal line 9, thereby avoiding existence of a voltage drop on the trigger signal line 9 which affects the display effect of the display panel, reducing the number of the trigger signal lines 9, and implementing the narrow edge of the display panel.

Figure 11:
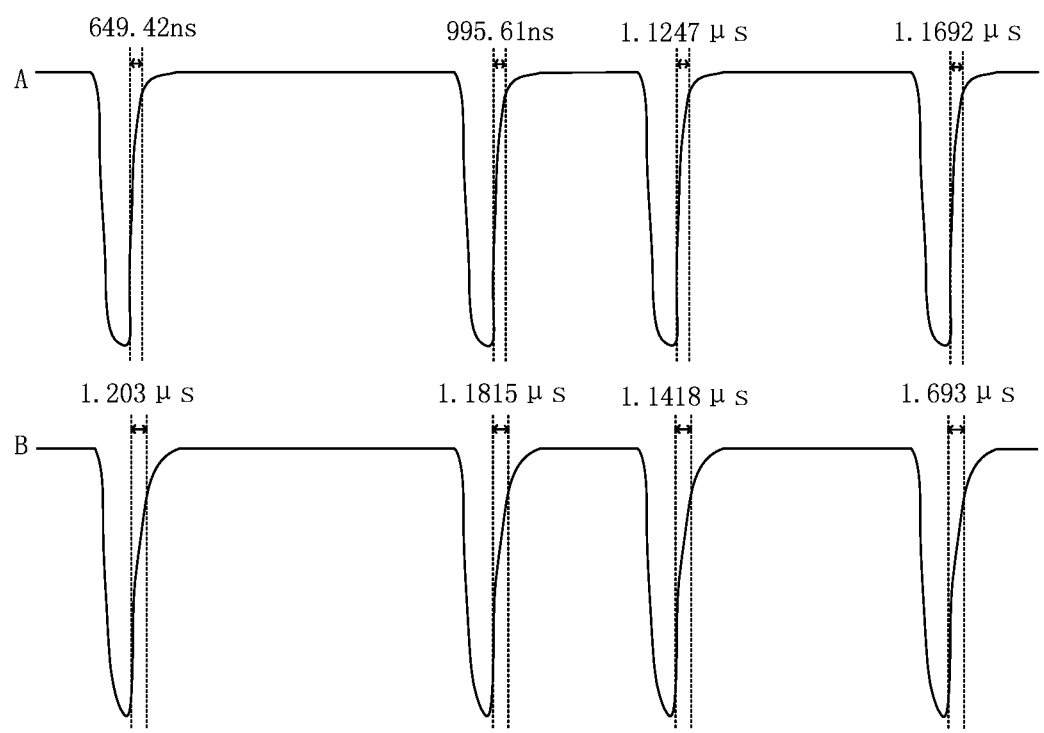
FIG. 11 is a schematic simulation diagram of a scan driving signal output from a first shift register according to an embodiment of the present disclosure.

FIG. 11 is a schematic simulation diagram of a scan driving signal output from a first shift register according to an embodiment of the present disclosure. Referring to FIGS. 2 and 11, FIG. 11 illustrates a simulation graph A of the scan driving signal output from the first shift register 41 in the related art and a simulation graph B of the scan driving signal output from the first shift register 41 which is electrically connected to the first clock signal line 51 through resistance compensation units 6. As shown in FIG. 11, in the related art, no resistance compensation unit 6 is disposed between the first shift register 41 and the first clock signal line 51. The delay at four positions of the simulation graph A is 649.42 ns, 995.61 ns, 1.1247 μs and 1.1692 μs, respectively. The first shift register 4 is electrically connected to the first clock signal line 51 through the resistance compensation units 6 in the embodiment of the present disclosure. The delay at the four positions of the simulation graph B changes into 1.203 ρs, 1.1815 ρs, 1.1418 μs and 1.1693 μs, respectively. It can be seen that the first shift register 41 is electrically connected to the first clock signal line 51 through the resistance compensation units 6, so that the delay of the drive signal output end F of the first shift register 41 outputting the scan driving signal to a corresponding scanning line 1 is increased, the difference between the delay of the scan driving signal in the first area B1 and the delay of the scan driving signal in the second area B2, which is caused by the number of pixel units 2 in each row in the first area B1 less than the number of pixel units 2 in each row in the second area B2, is reduced, and the difference in display brightness between the first area B1 and the second area B2 is reduced, thus the display uniformity of the display panel is improved.

Figure 12:
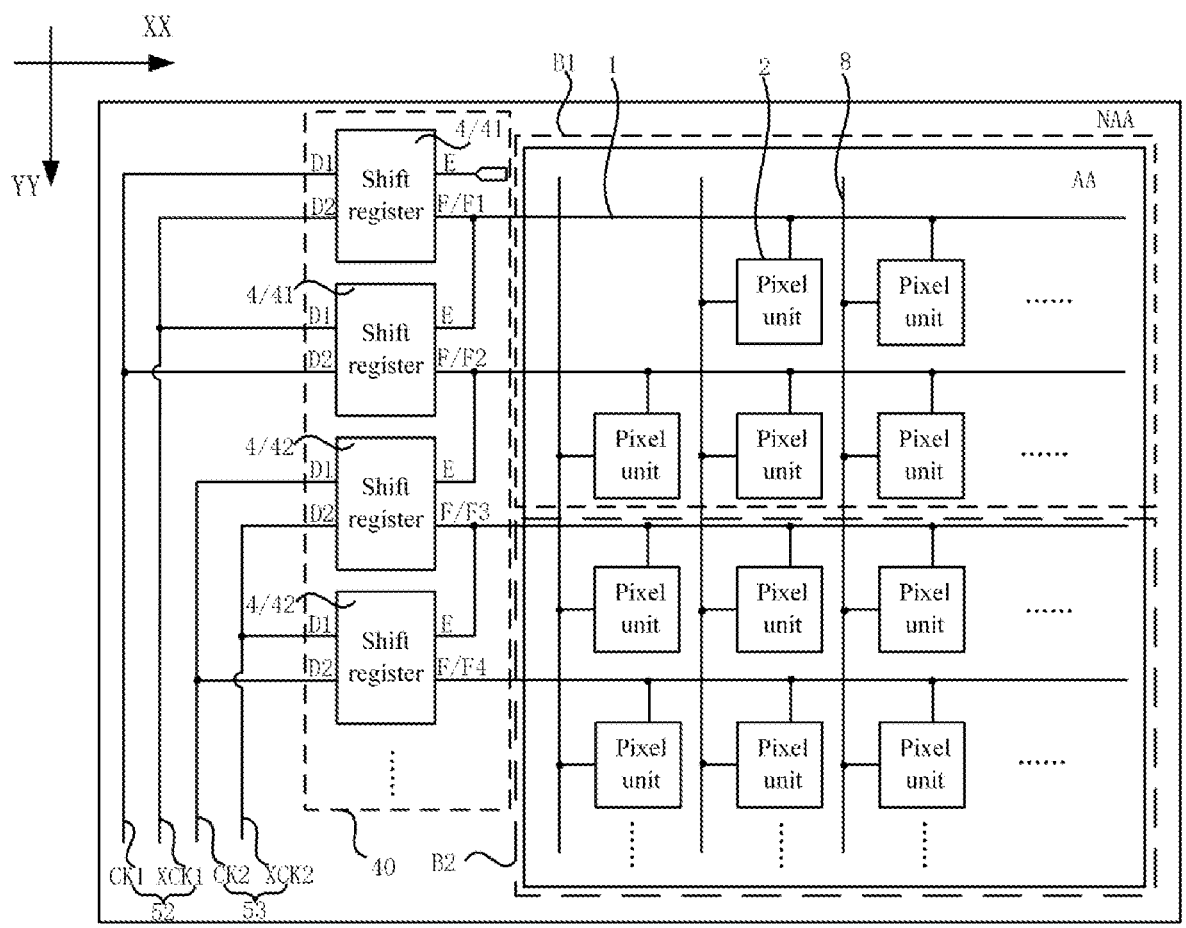
FIG. 12 is a structural diagram of another display panel according to an embodiment of the present disclosure.
Figure 13:
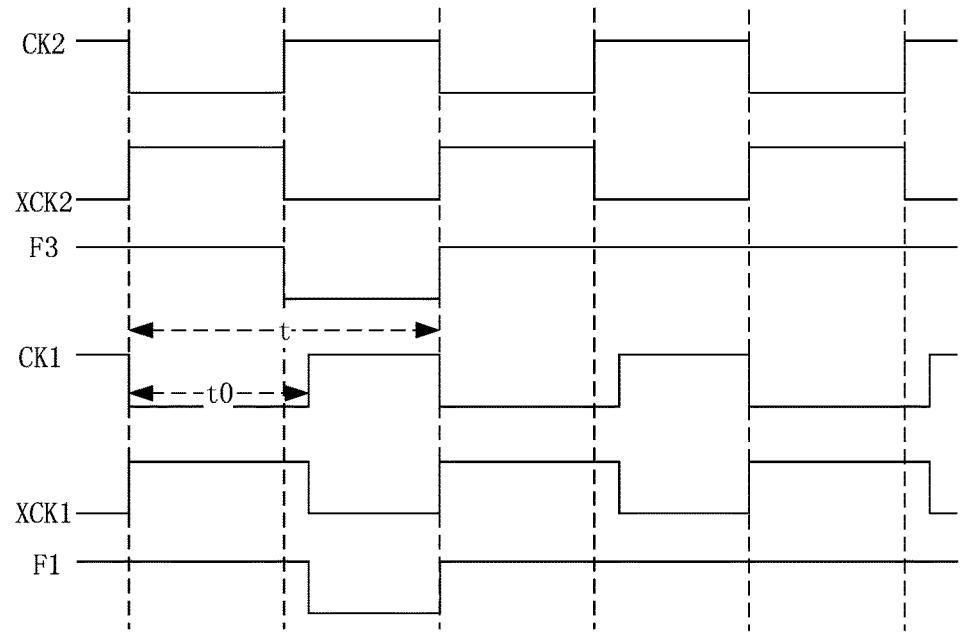
FIG. 13 is a drive timing diagram of the shift register shown in FIG. 12.

FIG. 12 is a structural diagram of another display panel according to an embodiment of the present disclosure. FIG. 13 is a drive timing diagram of the shift register shown in FIG. 12. Referring to FIGS. 12 and 13, unlike the display panel structure shown in FIG. 2, no resistance compensation unit is disposed in the display panel. The first shift registers 41 are electrically connected to a second clock signal line 52, the second shift registers 42 are electrically connected to a third clock signal line 53, and a duty ratio of an effective signal on the second clock signal line 52 is greater than a duty ratio of an effective signal on the third clock signal line 53.

Exemplarily, FIG. 13 illustrates the timing of a shift register 4 at the first stage and a register 4 at the third stage. Referring to FIGS. 12 and 13, the second clock signal line 52 includes a sub-clock signal line CK1 and a sub-clock signal line XCK1. The third clock signal line 53 includes a sub-clock signal line CK2 and a sub-clock signal line XCK2. Taking a clock signal on the sub-clock signal line CK1 as an example, referring to the above description of the working principle of the shift register, it is to be noted that the effective signal in the clock signal on the sub-clock signal line CK1 is low-level, then a duty ratio of the effective signal in the clock signal on the sub-clock signal line CK1 is a ratio between t0 and t; the effective signal in the clock signal on the sub-clock signal line XCK1 is high-level, and then a duty ratio of the effective signal in the clock signal on the sub-clock signal line XCK1 is a proportion of the high-level signal in the clock signal on the sub-clock signal line XCK1.

Specifically, referring to FIG. 12 and FIG. 13, the duty ratio of the effective signal on the second clock signal line 52 is greater than the duty ratio of the effective signal on the third clock signal line 53. The duty ratio of the effective signal on the sub-clock signal line CK1 may be greater than a duty ratio of an effective signal on the sub-clock signal line CK2. The duty ratio of the effective signal on the sub-clock signal line XCK1 is greater than a duty ratio of an effective signal on the sub-clock signal line XCK2. The effective signal in a scan driving signal output through a drive signal output end F of the shift register 4 to a corresponding scanning line 1 is low-level. Referring to the above description of the working principle of the shift register 4, taking the first-stage shift register 4 as an example, a falling edge of a low-level signal in the scan driving signal output through a drive signal output end F1 responses to a rising edge of the low-level effective signal on the sub-clock signal line CK1 and a falling edge of the high-level effective signal on the sub-clock signal line XCK1.

In FIG. 13, first three timing graphs correspond to the second shift register 42, last three timing graphs correspond to the first shift register 41. It can be seen that the duty ratio of the effective signal on the second clock signal line 52 which is electrically connected to the first shift register 41 is configured to be greater than the duty ratio of the effective signal on the third clock signal line 53 which is electrically connected to the second shift register 42, so that a delay of the first shift register 41 outputting the scan driving signal to a corresponding scanning line 1 is increased, the difference between a delay of the scan driving signal in the first area B1 and a delay of the scan driving signal in the second area B2, which is caused by the number of pixel units 2 in each row in the first area B1 less than the number of pixel units 2 in each row in the second area B2, is reduced, and the difference in display brightness between the first area B1 and the second area B2 is reduced, thus the display uniformity of the display panel is improved.

In one embodiment, as shown in FIG. 12, shift registers 4 includes one group of cascaded shift registers 40. The one group of cascaded shift registers 40 is disposed in a peripheral circuit area NAA on a side of a display area AA. Exemplarily, as shown in FIG. 12, the one group of cascaded shift registers 40 is disposed in the peripheral circuit area NAA on left side of the display area AA. The drive signal output ends F of the shift registers 4 are electrically connected to the scanning lines 1 in one-to-one correspondence. Each shift register 4 outputs a scan driving signal to the corresponding scanning line 1 through the drive signal output end F. The shift registers 4 at respective stages successively outputs the scan driving signals to the respective scanning lines 1 of the display panel. The pixel units 2 of the display panel receive corresponding scan driving signals row by row and are turned on accordingly. Each data signal line 8 inputs a data signal to a corresponding pixel unit 2, so that the display panel implements a display function.

Figure 14:
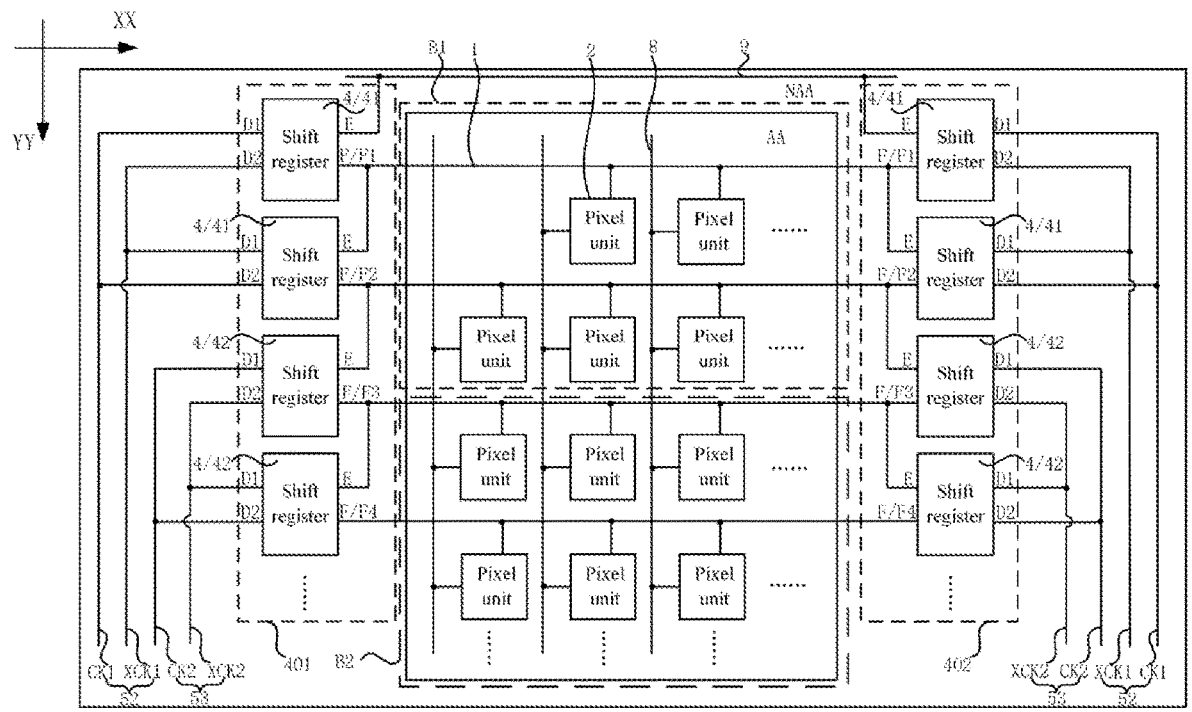
FIG. 14 is a structural diagram of another display panel according to an embodiment of the present disclosure.

FIG. 14 is a structural diagram of another display panel according to an embodiment of the present disclosure. As shown in FIG. 14, shift registers 4 include a first group of cascaded shift registers 401 and a second group of cascaded shift registers 402. The first group of cascaded shift registers 401 and the second group of cascaded shift registers 402 are disposed in two respective peripheral circuit areas NAA, which are disposed on two opposite sides of a display area AA. The shift registers 4 at a same stage in the first group of cascaded shift registers 401 and the second group of cascaded shift registers 402 are electrically connected to a same scanning line 1 for synchronously outputting scan driving signals to the same scanning line through drive signal output ends F.

Exemplarily, as shown in FIG. 14, both a duty ratio of an effective signal on a second clock signal line 52 which is electrically connected to the first shift register 41 in the first group of cascaded shift registers 401 and a duty ratio of an effective signal on the second clock signal line 52 which is electrically connected to the first shift register 41 in the second group of cascaded shift registers 402 may be configured to be greater than a duty ratio of an effective signal on a third clock signal line 53 which is electrically connected to the second shift register 42. The duty ratio of the effective signal on the second clock signal line 52 which is electrically connected to the first shift register 41 in the first group of cascaded shift registers 401 and the duty ratio of the effective signal on the second clock signal line 52 which is electrically connected to the first shift register 41 in the second group of cascaded shift registers 402 may be configured to be the same. This ensures that the first shift registers 41 connected to the same scanning line 1 synchronously output the scan driving signals through the drive signal output ends F to the same scanning line 1, increasing a delay of the first shift registers 41 outputting scan driving signals to scanning lines 1 in the first area B1, and improving the display uniformity of the display panel.

In one embodiment, as shown in FIG. 4, the shift registers 4 at the first stage in the first group of cascaded shift registers 401 and the second group of cascaded shift registers 402 may be configured to be electrically connected to the same trigger signal line 9. The trigger signal line 9 is used for transferring a trigger signal to the trigger signal input ends E of the shift registers 4 at the first stage in the first group of cascaded shift registers 401 and the second group of cascaded shift registers 402. Exemplarily, the trigger signal may input synchronously at opposite ends of the trigger signal line 9, thereby avoiding existence of a voltage drop on the trigger signal line 9 which affects the display effect of the display panel, reducing the number of the trigger signal lines 9, and implementing the narrow edge of the display panel.

It is to be noted that a first clock signal line 51 includes a first sub-clock signal line CK and a second sub-clock signal line XCK. The first clock signal line 51 in this embodiment of the present disclosure may be directly substituted by the first sub-clock signal line CK and the second sub-clock signal line XCK. For example, the first shift register 41 is electrically connected to the first clock signal line 51 through resistance compensation units 6, which means that the first shift register 41 is electrically connected to the first sub-clock signal line CK through a resistance compensation unit 6, and the first shift register 41 is electrically connected to the second sub-clock signal line XCK through a resistance compensation unit 6, and has no other meanings. Additionally, the second clock signal line 52 includes a sub-clock signal line CK1 and a sub-clock signal line XCK1. The third clock signal line 53 includes a sub-clock signal line CK2 and a sub-clock signal line XCK2. The second clock signal line 52 in this embodiment of the present disclosure may be directly substituted by a sub-clock signal line CK1 and a sub-clock signal line XCK1. The third clock signal line 53 may be directly substituted by a sub-clock signal line CK2 and a sub-clock signal line XCK2. For example, the duty ratio of the effective signal on the second clock signal line 52 is greater than that of the effective signal on the third clock signal line 53, which means that a duty ratio of the effective signal on the sub-clock signal line CK1 in the second clock signal line 52 is greater than a duty ratio of the effective signal on the sub-clock signal line CK2 in a corresponding third clock signal line 53, a duty ratio of the effective signal on the sub-clock signal line XCK1 in the second clock signal line 52 is greater than a duty ratio of the effective signal on the sub-clock signal line XCK2 in the corresponding third clock signal line 53, and has no other meanings.

It is to be noted that the accompanying draws in the embodiments of the present disclosure only represent the size of various components exemplarily, and do not represent the actual size of the various components in the display panel.

Figure 15:
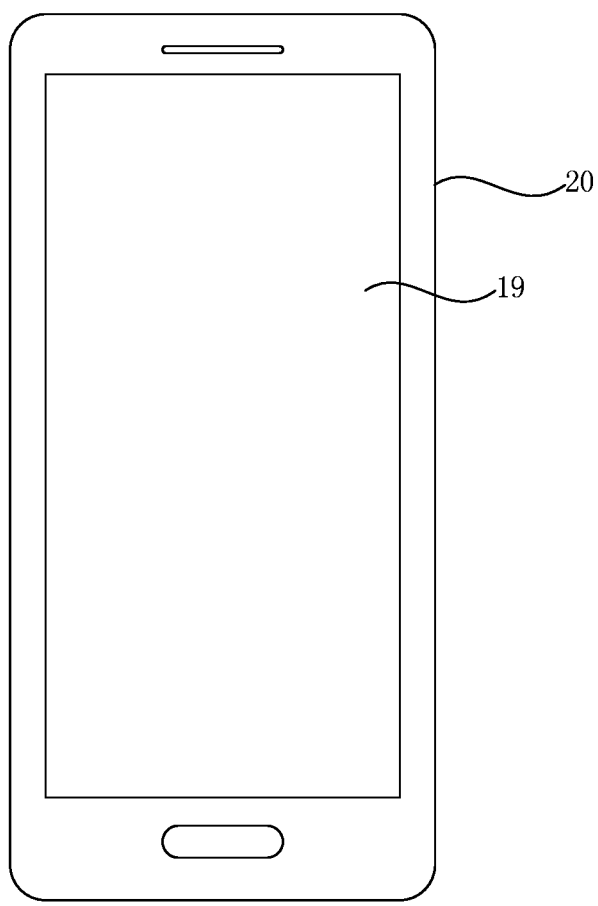
FIG. 15 is a structural diagram of a display device according to an embodiment of the present disclosure.

A display device is further provided by an embodiment of the present disclosure. FIG. 15 is a structural diagram of the display device according to the embodiment of the present disclosure. As shown in FIG. 15, the display device 20 includes a display panel 19 according to any of the above embodiments. Therefore, the display device 20 provided by the embodiment of the present disclosure also has the beneficial effect described in the above embodiments, thus details are not described here again. Exemplarily, the display device 20 may be a mobile phone, a computer, a television or another electronic device.

It is to be noted that the above are only preferred embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
   a display area and a peripheral circuit area surrounding the display area, wherein the display area comprises a first area and a second area, the display area comprises a plurality of scanning lines extending along a first direction, and along the first direction, a number of pixel units in each row in the first area is less than a number of pixel units in each row in the second area;
   the peripheral circuit area is provided with a plurality of shift registers, the plurality of shift registers comprise a plurality of first shift registers and a plurality of second shift registers, each of the plurality of first shift registers and each of the plurality of second shift registers are electrically connected to respective ones of the plurality of scanning lines, part of the scanning lines electrically connected to the plurality of first shift registers are disposed in the first area, and the other part of the scanning lines electrically connected to the plurality of second shift registers are disposed in the second area;
   wherein the plurality of first shift registers are electrically connected to a second clock signal line element, the plurality of second shift registers are electrically connected to a third clock signal line element, and a duty ratio of an effective signal on the second clock signal line element is greater than a duty ratio of an effective signal on the third clock signal line element;
   wherein the second clock signal line element comprises a second alpha sub-clock signal line and a second beta sub-clock signal line; wherein a second alpha sub-clock signal on the second alpha sub-clock signal line is reverse to a second beta sub-clock signal on the second beta sub-clock signal line;
   wherein the third clock signal line element comprises a third alpha sub-clock signal line and a third beta sub-clock signal line; wherein a third alpha sub-clock signal on the third alpha sub-clock signal line is reverse to a third beta sub-clock signal on the third beta sub-clock signal line;
   wherein a duty ratio of an effective signal of the second alpha sub-clock signal line is greater than a duty ratio of an effective signal of the third alpha sub-clock signal line, and a duty ratio of an effective signal of the second beta sub-clock signal line is greater than a duty ratio of an effective signal of the third beta sub-clock signal line.

2. The display panel according to claim 1, wherein the plurality of shift registers comprise a first group of cascaded shift registers and a second group of cascaded shift registers, the first group of cascaded shift registers and the second group of cascaded shift registers are separately located at two peripheral circuit areas disposed on two opposite sides of the display area; shift registers at a same stage in the first group of cascaded shift registers and the second group of cascaded shift registers are electrically connected to a same scanning line for synchronously outputting scan driving signals to the same scanning line.

3. The display panel according to claim 2, wherein a shift register at a first stage in the first group of cascaded shift registers and a shift register at a first stage of the second group of cascaded shift registers are electrically connected a same trigger signal line.

4. The display panel according to claim 1, wherein the display area comprises a first edge and a third edge disposed opposite to each other as well as a second edge and a fourth edge disposed opposite to each other, the first edge and the third edge extend along the first direction, the second edge and the fourth edge extend along a second direction, the second direction is perpendicular to the first direction; and adjacent edges of the display area are connected through a round corner in the first area.

5. The display panel according to claim 4, wherein the first edge, the second edge, the third edge or the fourth edge form a notch in the first area.

6. The display panel according to claim 1, Wherein the second alpha sub-clock signal has an effective signal at high-level, and the second beta sub-clock signal has an effective signal at low-level;
  wherein the third alpha sub-clock signal has an effective signal at high-level, and the third beta sub-clock signal has an effective signal at low-level.

7. A display device, comprising a display panel,
  wherein the display panel comprises:
  a display area and a peripheral circuit area surrounding the display area, wherein the display area comprises a first area and a second area, the display area comprises a plurality of scanning lines extending along a first direction, and along the first direction, a number of pixel units in each row in the first area is less than a number of pixel units in each row in the second area;
  the peripheral circuit area is provided with a plurality of shift registers, the plurality of shift registers comprise a plurality of first shift registers and a plurality of second shift registers, each of the plurality of first shift registers and each of the plurality of second shift registers are electrically connected to respective ones of the plurality of scanning lines, part of the scanning lines electrically connected to the plurality of first shift registers are disposed in the first area, and the other part of the scanning lines electrically connected to the plurality of second shift registers are disposed in the second area;
  wherein the plurality of first shift registers are electrically connected to a second clock signal line element, the plurality of second shift registers are electrically connected to a third clock signal line element, and a duty ratio of an effective signal on the second clock signal line element is greater than a duty ratio of an effective signal on the third clock signal line element;
  wherein the second clock signal line element comprises a second alpha sub-clock signal line and a second beta sub-clock signal line; wherein a second alpha sub-clock signal on the second alpha sub-clock signal line is reverse to a second beta sub-clock signal on the second beta sub-clock signal line;
  wherein the third clock signal line element comprises a third alpha sub-clock signal line and a third beta sub-clock signal line; wherein a third alpha sub-clock signal on the third alpha sub-clock signal line is reverse to a third beta sub-clock signal on the third beta sub-clock signal line;
  wherein a duty ratio of an effective signal of the second alpha sub-clock signal line is greater than a duty ratio of an effective signal of the third alpha sub-clock signal line, and a duty ratio of an effective signal of the second beta sub-clock signal line is greater than a duty ratio of an effective signal of the third beta sub-clock signal line.

* * * * *